United States Patent
Osuga

(10) Patent No.: US 7,622,515 B2
(45) Date of Patent: Nov. 24, 2009

(54) COMPOSITION OF EPOXY RESIN, PHENOLIC RESIN, SILICONE COMPOUND, SPHERICAL ALUMINA AND ULTRAFINE SILICA

(75) Inventor: Hironori Osuga, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 379 days.

(21) Appl. No.: 11/477,370

(22) Filed: Jun. 30, 2006

(65) Prior Publication Data

US 2006/0247391 A1  Nov. 2, 2006

Related U.S. Application Data

(62) Division of application No. 10/808,483, filed on Mar. 25, 2004, now abandoned.

(30) Foreign Application Priority Data

Mar. 28, 2003 (JP) .............. 2003-092804

(51) Int. Cl.
*C08K 3/22* (2006.01)
*C08K 3/36* (2006.01)
*C08L 63/00* (2006.01)
*C08L 63/04* (2006.01)
*H01L 23/29* (2006.01)

(52) U.S. Cl. ............ 523/457; 257/791; 257/793; 523/466; 525/476

(58) Field of Classification Search .......... None
See application file for complete search history.

(56) References Cited

U.S. PATENT DOCUMENTS

| 5,049,596 | A | | 9/1991 | Fujimoto et al. ...... 523/427 |
|---|---|---|---|---|
| 5,362,775 | A | | 11/1994 | Shintai et al. ......... 523/451 |
| 6,001,901 | A | | 12/1999 | Shiobara et al. ....... 523/443 |
| 6,117,953 | A | * | 9/2000 | Ichiroku et al. ....... 525/526 |
| 6,139,978 | A | * | 10/2000 | Arai et al. ............. 428/620 |
| 6,310,120 | B1 | | 10/2001 | Shiobara et al. ....... 523/458 |
| 6,500,564 | B1 | * | 12/2002 | Shiobara et al. ....... 428/620 |
| 6,506,822 | B2 | | 1/2003 | Ichiroku et al. ....... 523/435 |
| 7,053,018 | B2 | | 5/2006 | Kanbara et al. ....... 501/127 |
| 2006/0226525 | A1 | * | 10/2006 | Osuga et al. .......... 257/685 |

FOREIGN PATENT DOCUMENTS

| EP | 1 731 572 A1 | * | 12/2006 |
|---|---|---|---|
| JP | 63-202621 | | 8/1988 |
| JP | 63-275625 | | 11/1988 |
| JP | 1-9214 | | 1/1989 |
| JP | 1-109753 | | 4/1989 |
| JP | 1-203423 A | * | 8/1989 |
| JP | 2-51522 | | 2/1990 |
| JP | 2-182749 A | * | 7/1990 |
| JP | 4-18445 | | 1/1992 |
| JP | 4-132727 | | 5/1992 |
| JP | 4-139256 | | 5/1992 |
| JP | 7-278415 | | 10/1995 |
| JP | 10-12774 | | 1/1998 |
| JP | 2003-160714 | | 6/2003 |

* cited by examiner

*Primary Examiner*—Robert Sellers
(74) *Attorney, Agent, or Firm*—Smith, Gambrell & Russell

(57) ABSTRACT

The object of the present invention is to provide an epoxy resin composition which is excellent in flash characteristics and thermal conductivity, and gives an area mounting type semiconductor apparatus having little warpage and excellent temperature cycle properties. According to the present invention, there is provided an epoxy resin composition for semiconductor encapsulation which comprises, as essential components, (A) a spherical alumina, (B) an ultrafine silica having a specific surface area of 120-280 $m^2/g$, (C) a silicone compound, (D) an epoxy resin, (E) a phenolic resin as a curing agent, and (F) a curing accelerator, in which said ultrafine silica is contained in an amount of 0.2-0.8% by weight based on the total weight of the resin composition, and said silicone compound is a polyorganosiloxane and is contained in an amount of 0.3-2.0% by weight based on the total weight of the resin composition.

1 Claim, No Drawings

COMPOSITION OF EPOXY RESIN, PHENOLIC RESIN, SILICONE COMPOUND, SPHERICAL ALUMINA AND ULTRAFINE SILICA

CROSS-REFERENCE TO RELATED APPLICATIONS

This application is a division of U.S. patent application Ser. No. 10/808,483, filed on Mar. 25, 2004, now abandoned, which is relied on and incorporated herein by reference.

BACKGROUND OF THE INVENTION

The present invention relates to an epoxy resin composition for encapsulation of semiconductors and a semiconductor apparatus.

In accordance with the recent trend of market for miniaturization, weight-saving and high performance of electronic devices, high integration of semiconductors has advanced year by year, and, furthermore, surface mounting of semiconductor apparatus has been promoted. Under the circumstances, area mounting type semiconductor apparatuses have been newly developed and shifting to such new semiconductor apparatuses from those of conventional structures has started.

As area mounting type semiconductor apparatuses, representative are ball grid array (hereinafter referred to as "BGA"), and further miniaturized chip size package (hereinafter referred to as "CSP"), and these have been developed for meeting the demand for increase of the number of pins and speeding-up which have reached the limits with the surface mounting type semiconductor devices such as quad flat package (hereinafter referred to as "QFP") and small outline package (hereinafter referred to as "SOP").

As for the structures of the area mounting type semiconductor devices, semiconductor elements are mounted on one side of a rigid circuit substrate such as a bismaleimide triazine (hereinafter referred to as "BT") resin/copper foil circuit substrate or a flexible circuit substrate such as polyimide resin film/copper foil circuit substrate, and only the side of the substrate on which elements are mounted, namely, only the one side of the substrate is encapsulated with a resin composition by molding. Furthermore, on the side of the substrate opposite to the side on which the semiconductor elements are mounted, solder balls are two-dimensionally aligned and bond the substrate to a circuit substrate on which semiconductor devices are mounted. Moreover, as a substrate on which elements are mounted, there is proposed a structure which uses a metal substrate such as a lead frame in addition to the above organic circuit substrates.

These area mounting type semiconductor apparatuses have a structure of one-side encapsulation type according to which only the side of a substrate on which elements are mounted is encapsulated with a resin composition and the side on which solder balls are provided is not encapsulated. Very rarely, in the case of a metal substrate such as a lead frame, an encapsulation resin layer of several ten μm may also be present on the side on which solder balls are present, but an encapsulation resin layer of several hundred μm to several mm is formed on the side on which elements are mounted, and, therefore, this is substantially a one-side encapsulation type. Accordingly, warpages are apt to occur in these semiconductor apparatuses just after molding owing to mismatching in thermal expansion or thermal shrinkage between the organic substrate or metal substrate and the cured resin composition or owing to influence of curing shrinkage during molding and curing of the resin composition.

On the other hand, generation of heat from the semiconductor device steadily increases, and the necessity to dissipate the heat generated from the semiconductor device to the outside of the package through the epoxy resin composition for encapsulation of semiconductors has recently become very important. Hitherto, in the structure of area mounting type semiconductor apparatus, increase of the number of pins of external terminals and miniaturization of package are easy because of possibility of area mounting, and, hence, application of semiconductor devices which generate a large quantity of heat is promoted, and notice is given to dissipation of heat to the outside of the package (PKG). Particularly, in order to promote heat dissipation from the epoxy resin composition to the outside, metal plates which are high in heat dissipation are attached to the package, but there is the limit in promotion of the heat dissipation unless the heat dissipation of the epoxy resin composition for semiconductor encapsulation per se is promoted, and importance of promotion of heat dissipation of the epoxy resin composition is particularly noticed.

However, hitherto, epoxy resins for encapsulation high in thermal conductivity have been developed utilizing alumina and the like (JP-B-7-47682, pages 1-6 and Japanese Patent No. 2874089, pages 1-8), but when they are applied to structures of area mounting type semiconductor apparatuses, there are problems in moldability, especially, bad flash characteristics and leakage of flashes onto the substrate. Furthermore, because of the high modulus of elasticity, warpage occurs in the package and temperature cycle properties are inferior, and hence development of new epoxy resins for encapsulation having high thermal conductivity is of urgent necessity for area mounting type semiconductors.

The present invention provides an epoxy resin composition for semiconductor encapsulation in area mounting type semiconductor apparatuses which is excellent in its molding operability, especially, satisfactory in flash characteristics, and furthermore shows substantially no warpage during soldering treatment after molding and has high resistance to temperature cycle, high soldering crack resistance and high thermal conductivity, and further provides a semiconductor apparatus obtained using the above epoxy resin composition.

SUMMARY OF THE INVENTION

According to the present invention, it has been found that an epoxy resin composition for semiconductor encapsulation which has excellent moldability, low molding shrinkage, high resistance to temperature cycle, high soldering crack resistance and high thermal conductivity can be obtained by using a spherical alumina and a specific ultrafine silica at a specific ratio and further a silicone compound. That is, the present invention relates to an epoxy resin composition for semiconductor encapsulation which comprises, as essential components, (A) a spherical alumina, (B) an ultrafine silica having a specific surface area of 120-280 $m^2/g$, (C) a silicone compound, (D) an epoxy resin, (E) a phenolic resin curing agent, and (F) a curing accelerator, said ultrafine silica being contained in an amount of 0.2-0.8% by weight based on the total weight of the resin composition, said silicone compound being preferably a polyorganosiloxane, and being contained in an amount of preferably 0.3-2.0% by weight based on the total weight of the resin composition, and further relates to an area mounting type semiconductor apparatus produced using the above epoxy resin composition.

DETAILED DESCRIPTION OF THE INVENTION

The spherical alumina used in the present invention is not particularly limited as far as it is spherical. The shape of the spherical alumina is preferably close to true sphere for improvement of flowability. The average particle diameter is preferably 5-30 µm. If the average particle diameter is smaller than the lower limit or exceeds the upper limit, the flowability may be deteriorated. The amount of the spherical alumina used in the present invention is preferably 85-92% by weight based on the total weight of the resin composition. If the amount is less than the lower limit, thermal conductivity lowers, and besides the molded product of the area mounting type semiconductor apparatus is warped, which is not preferred. If the amount exceeds the upper limit, thermal conductivity is improved, but flowability is inferior, which is not preferred. Furthermore, if necessary, the spherical alumina used in the present invention may be previously coated with a coupling agent, an epoxy resin or a phenolic resin. The coating can be carried out by mixing them using a solvent and thereafter removing the solvent or by directly adding them to an inorganic filler and mixing them using a mixer.

The ultrafine silica used in the present invention is required to have a specific surface area of 120-280 $m^2/g$ and to be added in an amount of 0.2-0.8% by weight based on the total weight of the resin composition. When only the spherical alumina is used, flash characteristics during molding are inferior to cause the problem of leakage of the flash onto the substrate in molding of the area mounting type semiconductor apparatus, but when the ultrafine silica is added, the flash characteristics can be considerably improved. The specific surface area of the ultrafine silica is 120-280 $m^2/g$, and if it is less than the lower limit, long flashes are produced to deteriorate the flash characteristics, and if it exceeds the upper limit, the composition increases in viscosity to deteriorate flowability. Furthermore, the amount of the ultrafine silica in the whole resin composition is 0.2-0.8% by weight, and if the amount is less than the lower limit, long flashes are produced to deteriorate the flash characteristics, and if it exceeds the upper limit, the composition increases in viscosity to deteriorate flowability.

The silicone compound used in the present invention includes silicone rubber, silicone oil, or the like, and a polyorganosiloxane which is a silicone oil is particularly suitable. The polyorganosiloxanes include polysiloxanes having a skeleton of dimethylpolysiloxane, diphenylpolysiloxane or methylphenylpolysiloxane, and preferably have in their main chain or side chain an organic substituent having C, O, N or S atom in addition to methyl group or phenyl group in order to impart affinity with epoxy resins and phenolic resins. Specifically, the organic substituents include amino group-substituted organic groups, epoxy group-substituted organic groups, hydroxyl group-substituted organic groups, vinyl group-substituted organic groups, mercapto group-substituted organic groups, carboxyl group-substituted organic groups, phenethyl group-substituted organic groups, acryl group-substituted organic groups, alkoxy group-substituted organic groups, polyether group-substituted organic groups, caprolactone group-substituted organic groups, ureide group-substituted organic groups, isocyanate group-substituted organic groups, etc., and the organic substituents are not limited to these examples. When high heat conductive fillers such as alumina are used, the modulus of elasticity of the composition increases, resulting in large warpage during soldering treatment after molding, and furthermore the resistance to temperature cycle lowers. The polyorganosiloxane used in the present invention has the action to reduce the warpage of semiconductor apparatus caused by decrease in modulus of elasticity of the epoxy resin composition, and is suitable for relaxation of stress generated at the time of temperature cycle test and can improve reliability in mounting. The amount of the polyorganosiloxane is preferably 0.3-2.0% by weight based on the total weight of the epoxy resin composition. If the amount is less than the lower limit, the modulus of elasticity cannot be greatly reduced and the effect to reduce warpage becomes smaller, and temperature cycle resistance is also inferior, and if it exceeds the upper limit, flowability and curability are deteriorated.

The epoxy resins used in the present invention are all of monomers, oligomers and polymers having epoxy group, and molecular weight and molecular structure thereof are not particularly limited. Examples of the epoxy resins are triphenolmethane type epoxy resins, bisphenol type epoxy resins, stilbene type epoxy resins, o-cresol novolak type epoxy resins, epoxy resins containing naphthalene skeleton, dicyclopentadiene type epoxy resins, etc. These may be used each alone or in admixture.

The phenolic resins used in the present invention include all of monomers, oligomers and polymers having at least two phenolic hydroxyl groups which can form a crosslinked structure through a curing reaction with the above epoxy resin, and molecular weight and molecular structure thereof are not particularly limited. Examples of the phenolic resins are phenolic aralkyl resins such as phenolic novolak resins, cresol novolak resins, p-xylylene-modified phenolic resins and m-xylylene•p-xylylene-modified phenolic resins, resins containing naphthalene skeleton, terpene-modified phenolic resins, dicyclopentadiene-modified phenolic resins, etc. These may be used each alone or in admixture.

The curing accelerators used in the present invention include those which can act as catalysts for the crosslinking reaction of the above epoxy resin and phenolic resin, and those which are generally used as encapsulating materials can be used. Examples of the curing accelerators are amine compounds such as 1,8-diazabicyclo(5,4,0)undecene-7 and tributylamine, organic phosphorus compounds such as triphenylphosphine and tetraphenylphosphonium•tetraphenyl borate, and imidazole compounds such as 2-methylimidazole. The curing accelerators are not limited to these examples. These may be used each alone or in admixture.

The epoxy resin composition of the present invention may optionally contain, in addition to the components (A)-(F), various additives, for example, inorganic ion exchangers such as hydrated bismuth oxide and magnesium-aluminum compounds, coupling agents such as γ-glycidoxypropyltrimethoxysilane, coloring agents such as carbon black and red oxide, releasing agents such as natural waxes, synthetic waxes, higher fatty acids and metal salts thereof and paraffin, flame retardants such as brominated epoxy resins, antimony oxide, phosphate esters, phosphazene compounds, aluminum hydroxide and magnesium hydroxide, antioxidants, etc.

The epoxy resin composition of the present invention is obtained by cold mixing the components (A)-(F) and other additives by a mixer, melt kneading the mixture by a kneading machine such as a roll, a kneader or an extruder, cooling the kneaded product and then grinding the product.

In order to make semiconductor apparatuses by encapsulating electronic parts such as semiconductor elements using the resin composition of the present invention, cure molding can be carried out by a molding method such as transfer molding, compression molding or injection molding.

DESCRIPTION OF PREFERRED EMBODIMENT

The present invention will be explained in more detail by the following examples, which should not be construed as limiting the invention in any manner.

EXAMPLE 1

| | |
|---|---|
| o-Cresol novolak epoxy resin (softening point: 62° C. and epoxy equivalent: 200) | 5.3% by weight |
| Phenolic novolak resin (softening point: 90° C. and hydroxyl equivalent: 103) | 2.7% by weight |
| Spherical alumina 1 (average particle diameter: 13.7 μm) | 90.0% by weight |
| Ultrafine silica 1 (specific surface area: 180 m²/g) | 0.5% by weight |
| Silicone rubber (average particle diameter: 5 μm) | 1.0% by weight |
| Triphenylphosphine | 0.1% by weight |
| Carbon black | 0.2% by weight |
| Carnauba wax | 0.2% by weight |

The above components were mixed at room temperature by a mixer, and the mixture was kneaded by twin roll at 70-120° C., cooled and then ground to obtain a resin composition. The resulting resin composition was evaluated by the following methods.

[Evaluation Methods]

Spiral flow: This was measured using a mold for measurement of spiral flow which is in accordance with EMMI-1-66 at a mold temperature of 175° C., under an injection pressure of 6.9 MPa for a curing time of 2 minutes. The unit of the spiral flow was cm. A spiral flow of 100 cm or more was judged to be good.

Thermal conductivity: A molded product of 40 mm in diameter and 30 mm in thickness was prepared using a transfer molding machine at a mold temperature of 175° C., under an injection pressure of 6.9 MPa for a curing time of 2 minutes. This was post-cured at 175° C. for 8 hours, and the thermal conductivity of the resulting molded article was measured by a thermal conductivity meter (QTM-500 manufactured by Kyoto Electronic Industry Co., Ltd.). The unit of the thermal conductivity was W/mK. A thermal conductivity of 3 W/mK or more was judged to be good.

Warpage of package: A 225 pBGA (substrate: bismaleimide triazine/glass cloth substrate of 0.36 mm in thickness; package size: 24×24 mm with a thickness of 1.17 mm; silicon chip: 9×9 mm in size with a thickness of 0.35 mm) was prepared using a transfer molding machine at a mold temperature of 175° C., under an injection pressure of 6.9 MPa for a curing time of 90 seconds, and this was post-cured at 175° C. for 8 hours. The cured product was cooled to room temperature, and thereafter displacement in height direction was measured in diagonal direction from the gate of the package using a surface roughness meter, and a value in which the difference in displacement was largest was taken as the warpage. The unit of the warpage was μm. A warpage of 100 μm or less was judged to be good.

Length of flash: In the same manner as in the measurement of warpage of package, a 225 pBGA was molded, and the length of resin flash which escaped from the venting portion of about 30 μm thick was measured. The unit of the length of flash was mm. A length of flash of 1 mm or less was judged to be good.

Temperature cycle property: In the same manner as in the measurement of warpage of package, a 225 pBGA was molded, and this was post-cured at 175° C. for 2 hours to obtain 10 samples, each. Each 10 samples were subjected to temperature cycle test of 1000 cycles, one cycle of which consists of 65° C., 30 minutes and 150° C., 30 minutes. It was examined whether internal cracking and various separations at interface occurred or not. When the number of rejected packages in which cracking and separation were observed was n, this is shown by n/10.

EXAMPLES 2-9 AND COMPARATIVE EXAMPLES 1-6

In accordance with the formulations as shown in Table 1 and Table 2, resin compositions were prepared and evaluated in the same manner as in Example 1. The results of the evaluation are shown in Table 1 and Table 2. Starting materials other than those used in Example 1 are shown below.

Spherical alumina 2 (average particle diameter: 28.1 μm)
Ultrafine silica 2 (specific surface area: 240 m²/g)
Ultrafine silica 3 (specific surface area: 100 m²/g)
Ultrafine silica 4 (specific surface area: 340 m²/g)
Spherical silica (average particle diameter: 14.6 μm)
Polyorganosiloxane represented by the following formula (1):

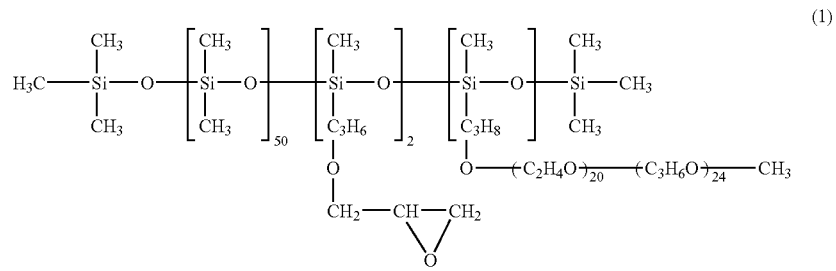

TABLE 1

|  | Example | | | | | | | | |
|---|---|---|---|---|---|---|---|---|---|
|  | 1 | 2 | 3 | 4 | 5 | 6 | 7 | 8 | 9 |
| O-Cresol novolak epoxy resin | 5.3 | 5.3 | 4.0 | 5.3 | 5.0 | 7.3 | 5.3 | 5.5 | 5.2 |
| Phenolic novolak resin | 2.7 | 2.7 | 2.0 | 2.7 | 2.5 | 3.7 | 2.7 | 2.7 | 2.6 |
| Spherical alumina 1 | 90.0 | 90.0 | 90.0 | 90.0 | 90.0 | 87.0 |  | 90.0 | 90.0 |
| Spherical alumina 2 |  |  |  |  |  |  | 90.0 |  |  |
| Ultrafine silica 1 (specific surface area 180 m$^2$/g) | 0.5 | 0.5 | 0.5 |  | 0.5 | 0.5 | 0.5 | 0.3 | 0.7 |
| Ultrafine silica 2 (specific surface area 240 m$^2$/g) |  |  |  | 0.5 |  |  |  |  |  |
| Silicone rubber | 1.0 |  |  |  |  | 1.0 |  |  |  |
| Polyorganosiloxane represented by the formula (1) |  | 1.0 | 3.0 | 1.0 | 1.5 |  | 1.0 | 1.0 | 1.0 |
| Triphenylphosphine | 0.1 | 0.1 | 0.1 | 0.1 | 0.1 | 0.1 | 0.1 | 0.1 | 0.1 |
| Carbon black | 0.2 | 0.2 | 0.2 | 0.2 | 0.2 | 0.2 | 0.2 | 0.2 | 0.2 |
| Carnauba wax | 0.2 | 0.2 | 0.2 | 0.2 | 0.2 | 0.2 | 0.2 | 0.2 | 0.2 |
| Spiral flow (cm) | 120 | 130 | 100 | 120 | 120 | 160 | 110 | 140 | 110 |
| Thermal conductivity (W/Mk) | 3.5 | 3.5 | 3.5 | 3.5 | 3.5 | 3.2 | 3.5 | 3.5 | 3.5 |
| Warpage of package (μm) | 85 | 80 | 50 | 90 | 75 | 95 | 85 | 85 | 90 |
| Length of flash (mm) | <1 | <1 | <1 | <1 | <1 | <1 | <1 | <1 | <1 |
| Temperature cycle property: The number of rejected packages after 500 cycles | 0/10 | 0/10 | 0/10 | 0/10 | 0/10 | 0/10 | 0/10 | 0/10 | 0/10 |
| Temperature cycle property: The number of rejected packages after 1000 cycles | 2/10 | 1/10 | 0/10 | 0/10 | 0/10 | 2/10 | 2/10 | 0/10 | 1/10 |

TABLE 2

|  | Comparative Example | | | | | |
|---|---|---|---|---|---|---|
|  | 1 | 2 | 3 | 4 | 5 | 6 |
| O-Cresol novolak epoxy resin | 5.6 | 5.0 | 5.3 | 5.3 | 6.0 | 5.3 |
| Phenolic novolak resin | 2.8 | 2.5 | 2.7 | 2.7 | 3.0 | 2.7 |
| Spherical alumina 1 | 90.0 | 90.0 | 90.0 | 90.0 | 90.0 |  |
| Spherical silica |  |  |  |  |  | 90.0 |
| Ultrafine silica 1 (specific surface area 180 m$^2$/g) | 0.1 | 1.0 |  |  | 0.5 | 0.5 |
| Ultrafine silica 3 (specific surface area 100 m$^2$/g) |  |  | 0.5 |  |  |  |
| Ultrafine silica 4 (specific surface area 340 m$^2$/g) |  |  |  | 0.5 |  |  |
| Polyorganosiloxane represented by the formula (1) | 1.0 | 1.0 | 1.0 | 1.0 |  | 1.0 |
| Triphenylphosphine | 0.1 | 0.1 | 0.1 | 0.1 | 0.1 | 0.1 |
| Carbon black | 0.2 | 0.2 | 0.2 | 0.2 | 0.2 | 0.2 |
| Carnauba wax | 0.2 | 0.2 | 0.2 | 0.2 | 0.2 | 0.2 |
| Spiral flow (cm) | 130 | 80 | 130 | 70 | 130 | 150 |
| Thermal conductivity (W/Mk) | 3.5 | 3.5 | 3.5 | 3.5 | 3.5 | 0.9 |
| Warpage of package (μm) | 80 | 85 | 80 | 90 | 120 | 65 |
| Length of flash (mm) | 3 | <1 | 2 | <1 | <1 | <1 |
| Temperature cycle property: The number of rejected packages after 500 cycles | 0/10 | 0/10 | 0/10 | 0/10 | 3/10 | 0/10 |
| Temperature cycle property: The number of rejected packages after 1000 cycles | 0/10 | 1/10 | 1/10 | 0/10 | 10/10 | 0/10 |

According to the present invention, an epoxy resin composition excellent in flash characteristics and thermal conductivity can be obtained, and area mounting type semiconductor apparatuses produced using the resin composition have little warpage and excellent temperature cycle properties.

What is claimed is:

1. A semiconductor apparatus in which a semiconductor element is mounted on one side of a substrate and only the one side of the substrate on which the semiconductor element is mounted is encapsulated with an epoxy resin composition, the epoxy resin composition comprising:
   (A) a spherical alumina,
   (B) an ultrafine silica having a specific surface area of 120-280 m2/g,
   (C) a silicone compound,
   (D) an epoxy resin,
   (E) a phenolic resin curing agent, and
   (F) a curing accelerator,
   wherein the ultrafine silica being contained in an amount of 0.2-0.8% by weight based on a total weight of the resin composition, the silicone compound (C) is a polyorganosiloxane having in its side chain an epoxy substituted organic group and a polyether substituted organic group, and the amount of the silicone compound is 0.3-2.0% by weight based on the total weight of the resin composition and the spherical alumina is between 85% and 92% by weight of the total composition.

* * * * *